United States Patent [19]
Hasegawa et al.

[11] Patent Number: 5,237,217
[45] Date of Patent: Aug. 17, 1993

[54] DECODER CIRCUIT WITH A DIFFERENTIAL AMPLIFIER AND APPLICATIONS THEREOF

[75] Inventors: Junko Hasegawa; Toshio Yamada, both of Osaka, Japan

[73] Assignee: Matsushita Electric Industrial Co., Ltd., Osaka, Japan

[21] Appl. No.: 791,256

[22] Filed: Nov. 13, 1991

[30] Foreign Application Priority Data

Nov. 14, 1990 [JP] Japan .................. 2-309852
May 13, 1991 [JP] Japan .................. 3-107460

[51] Int. Cl.$^5$ ................ H03K 19/082; H03K 19/094
[52] U.S. Cl. ........................... 307/463; 307/449
[58] Field of Search ........... 307/448, 449, 463, 494, 307/530

[56] References Cited

U.S. PATENT DOCUMENTS

| | | | |
|---|---|---|---|
| 4,354,175 | 10/1982 | Goldstein | 307/449 |
| 4,399,372 | 8/1983 | Tanimoto et al. | 307/449 |
| 4,590,388 | 5/1986 | Clemons et al. | 307/449 |
| 5,017,812 | 5/1991 | Wu | 307/449 |

FOREIGN PATENT DOCUMENTS

| | | |
|---|---|---|
| 55-30897 | 1/1980 | Japan . |
| 55-34394 | 4/1980 | Japan . |
| 55-34396 | 4/1980 | Japan . |
| 03-34192 | 1/1991 | Japan . |

Primary Examiner—Edward P. Westin
Assistant Examiner—Richard Roseen
Attorney, Agent, or Firm—Willian Brinks Olds Hofer Gilson & Lione

[57] ABSTRACT

There is disclosed a decoder circuit applicable to a decoding circuit of a DRAM which is comprised of a differential amplifier, first and second differential amplification lines connected to the differential amplifier, a pair of P-channel transistors connected between the first and second lines to precharge them up to a predetermined voltage in response to a clock signal applied to gates thereof, and one N-channel transistor connected between the first line and a ground line the gate of which is connected to either of non-reversible and reversible address signal lines. There is also disclosed an address selection circuit as an application of the above mentioned decoder circuit.

7 Claims, 13 Drawing Sheets

DECODER CIRCUIT WITH A DIFFERENTIAL AMPLIFIER AND APPLICATIONS THEREOF

BACKGROUND OF THE INVENTION

1. Field of the Invention

The present invention relates to a decoder circuit for a semiconductor memory device such as a dynamic random access memory (DRAM).

2. Description of the Prior Art

In a DRAM of 1 MB, the access time thereof is typically 100 ns. As the volume of DRAM is increased a shorter access time is demanded. In fact, the access time of 4 MB DRAM is typically 80 ns and that of 16 MB DRAM is typically required to speed-up to 60 ns. Further, it is forecasted that 64 MB DRAM will have an access time of 40 to 50 ns.

In an improved 64 MB DRAM, the time for reading data from and/or writing data into a memory cell is speeded up from 14.5 ns to 9.5 ns with respect to column switches. Further, the time for data output measured after the operations of the column switch is also speeded up from 14.5 ns to 10.5 ns. However, the time needed from an input of $\overline{RAS}$ signal the rising edge of a word line still needs 13 ns. In order to speed up the access time more, it is necessary to quicken the word line selecting operations. This necessitates a decoder circuit having a much faster operation time.

Conventionally, some improvements related to the memory cell and the sense amplifier of DRAM have been proposed in order to speed up the same using differential amplifiers for the sense amplifiers (See, for example, Japanese patent laid-open publications No. S 55-34394, S 55-3089, S 55-3496 and so on).

Further, in Japanese laid-open publications No. H 3-34192, there has been proposed to speed up the differential amplifier to be used for the sense amplifier which reads data from and writes data into the memory cell.

However, as far as the decoder circuit as a peripheral circuit of DRAM is concerned, nothing has been proposed to speed up the access time of DRAM.

FIG. 19 shows a conventional decoder circuit of NOR type. In operational of this circuit, when a P-channel transistor 204 is turned on at "L" level of a clock signal Φs, a decode output line 201 is precharged up to a power source level at first. If input signal decode lines $\overline{AO}$ and AN, namely, 212 and 221 are selected, input signal decoding signals of "L" level are applied thereto and thereby, N channel transistors 231 and 232 are turned off. Thus, the decode output line 201 is not discharged and a signal of "H" level is outputted as a decode signal through drivers 202 and 203 functioning as buffers.

If 212 and 221 are not selected, an input signal decoding signal of "H" level is applied to either or both of them, and thereby, at least one of N-channel transistors 231 and 232 is turned on. Thus, the decode output line 201 is discharged down to "L" level and, thereby, a signal of "L" level is outputted through drivers 202 and 203.

This type of decoder circuit has a disadvantage in that it is difficult to speed up because the decoder circuit does not operate until the decode line has been discharged perfectly. Further, it has a disadvantage in that a large circuit occupation area is needed because the area of each transistor for pull-down is inevitably enlarged to give a high driving capability.

In a semiconductor memory of a large volume, some problems are caused as follows; delay time to an input signal becomes serious since the wiring length thereof is needed to be lengthy, the access time becomes long because the number of memories connected to each word line is increased resulting in a large wiring capacitance thereof, and an area to be shared for the address decode circuit becomes large because the bit number of an input signal is increased.

SUMMARY OF THE INVENTION

One of objects of the present invention is to provide a decoder circuit capable of highly speeding up the operation thereof and minimizing the occupation area thereof.

Another object of the present invention is to provide a decoder circuit especially suitable for the DRAM of a large capacity which is capable of quickening the access time thereof.

One more object of the present invention is to provide an address selection circuit which is capable of speeding up the access time of DRAMs of a large capacity.

In order to achieve these objects, according to the present invention, there is provided a decoder circuit comprising a differential amplifier, first and second differential amplification lines connected to the differential amplifier, a voltage setting means for setting said first and second differential amplification lines at a predetermined voltage in response to a clock signal, and a voltage changing means for changing the voltage of the first differential amplification line from the predetermined voltage to another voltage in response to an input signal decoder signal.

The present invention further provides an address selection circuit being comprised of a plurality of decoding units each connected to a pair of inverted and non-inverted address signal lines, the decoding unit comprising a differential amplifier, first and second differential amplification lines connected to the differential amplifier, a voltage setting means for setting the first and second differential amplification lines at a predetermined voltage in response to a clock signal, a pair of voltage changing means for changing the voltage of the first differential amplification line from the predetermined voltage to another voltage in response to an address signal, the pair of voltage changing means being connected to a pair of non-reversible and reversible address lines, respectively, and fuse means connected to each of the pair of voltage changing means for making the voltage changing means inactive in the case that the fuse means has been metted down beforehand.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 12:
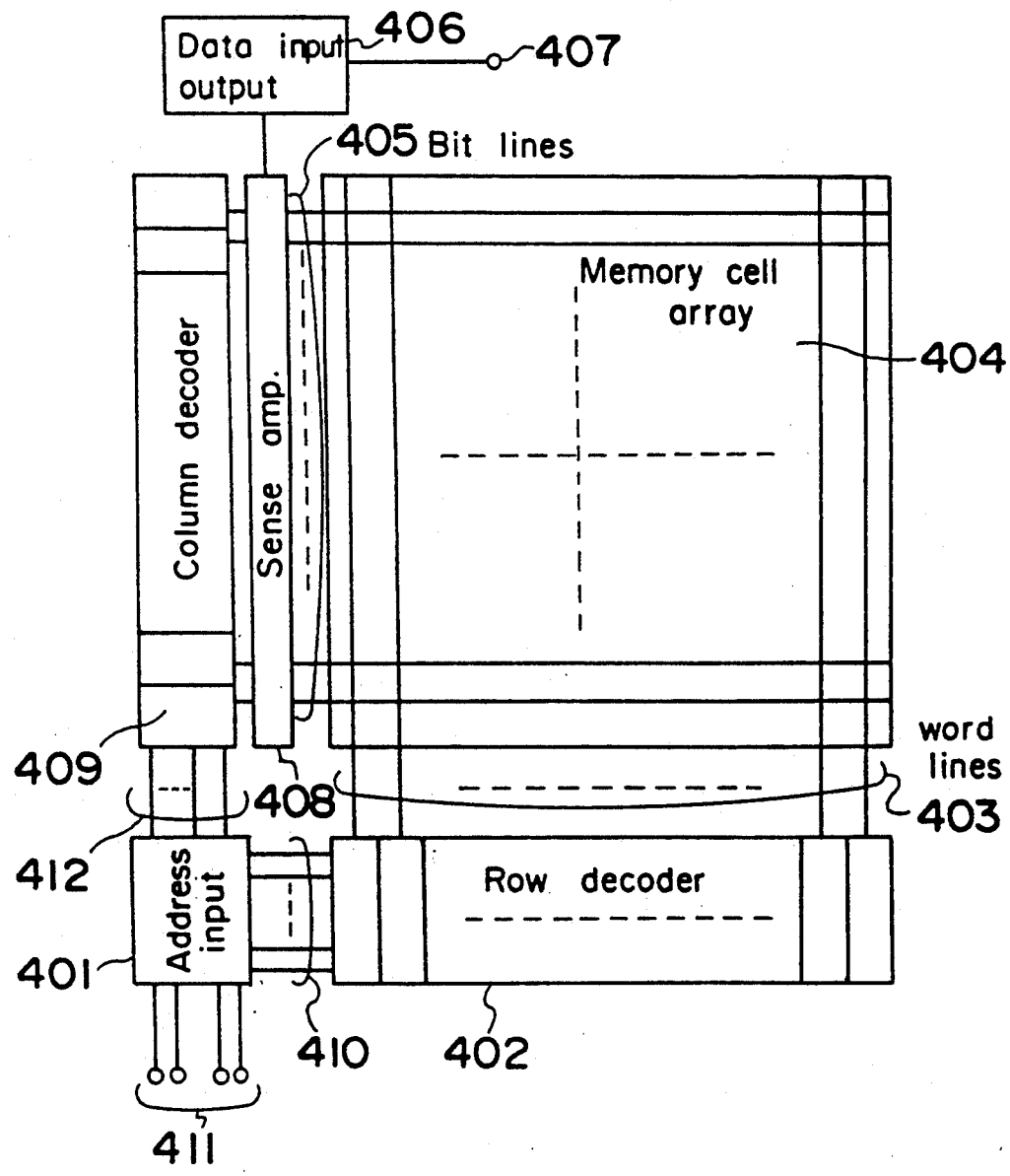
FIG. 12 is a block diagram of DRAM to which the present invention is applied.

FIG. 12 shows a block diagram of a DRAM comprising an address input circuit 401, a row decoder 402, a memory cell array 404 connected to the row decoder through word lines 403, a sense amplifier connected to the memory cell array through bit lines 405, data input-/output circuit 406 and a column decoder 409.

In operation of the DRAM, when an address signal is input to the address input circuit 401 through input terminals 411, the address is divided into row and column addresses and they are sent, through address signal lines 410 and 412, to the row decoder 402 and the column decoder 409, respectively. The row decoder 402 selects a word line by decoding the row address input thereto and, when one bit line is designated by the column decoder 409, data is written into or read out from a memory cell designated by the address through the sense amplifier 405.

The decoder circuit according to the present invention is applicable to the row decoder 402 and/or the column decoder 409.

1st Preferred Embodiment

Figure 1:
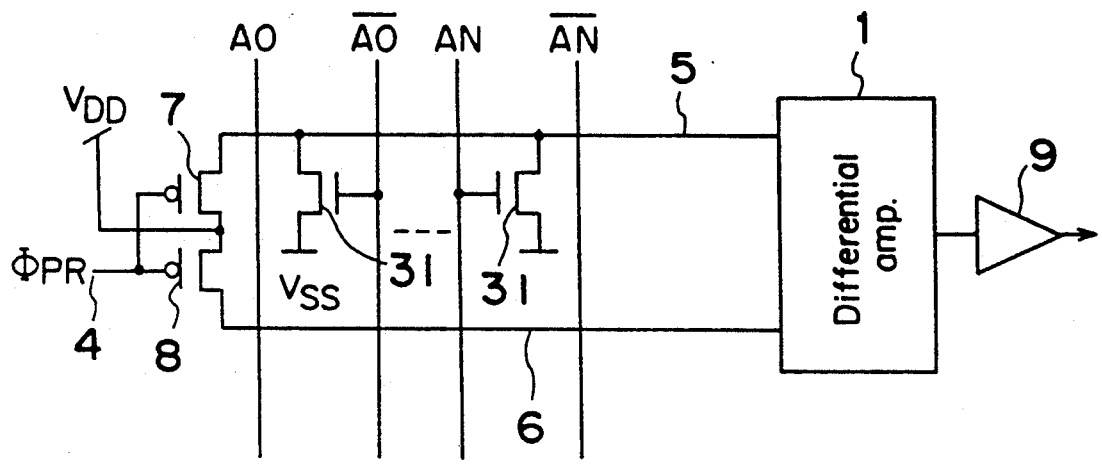
FIG. 1 is a circuit diagram of the decoder circuit according to the first preferred embodiment of the present invention.

FIG. 1 shows one unit of a decoder circuit according to the first preferred embodiment of the present invention.

The decoder includes a differential amplifier 1 to which two differential amplification lines 5 and 6 are connected. These lines 5 and 6 are connected to P-channel transistors 7 and 8 which are connected in parallel to a power source line $V_{DD}$ and a clock input terminal 4. Each pair of input signal decode lines A0 and $\overline{A0}$, A1 and $\overline{A1}$, ..., An and $\overline{AN}$ is formed to cross the differential amplification lines 5 and 6 and an N-channel transistor 31 is provided per each pair of input signal decode lines for pulling down the voltage of the first differential amplification line 5.

In operation of the decoder circuit, when the clock signal $\Phi_{PR}$ is dropped down to "L" level, the P-channel transistors 7 and 8 are turned on and thereby, both differential amplification lines 5 and 6 are precharged up to the power source level $V_{DD}$.

If input signal decode lines $\overline{A0}$ and AN are selected, input signal decode signals of "L" level are applied thereto, respectively.

Accordingly, both N-channel transistors 31 are turned off and the differential amplification line 5 is not discharged. Thus, both differential amplification lines 5 and 6 are maintained at "H" level. This difference between two potentials is amplified by the differential amplifier 1 and the result is outputted through a driver 9 serving as a buffer.

If neither of 0-th and N-th pairs are selected, an input signal decode signal of "H" level is applied to at least one of the input signal decode lines $\overline{A0}$ and AN.

Thereby, at least one of the N-channel transistors is turned on and, accordingly, the first differential amplification line 5 is discharged to the ground level $V_{SS}$. Therefore, the potential of the first differential amplification line 5 becomes lower than that of the second line 6 and the deference therebetween is amplified by the differential amplifier 1 and the result is outputted through the driver 9.

According to this preferred embodiment, it becomes possible to output the result decoded before the differential amplification line 5 has been fully discharged by amplifying the potential difference between the first and second differential amplification lines 5 and 6. Thus, the operation time of the decoder circuit can be quickened up to about 50% of that of the conventional NOR type decoder circuit when using a highly sensitive differential amplifier since delay time until the drive of CMOS inverter is shortened.

Figure 2:
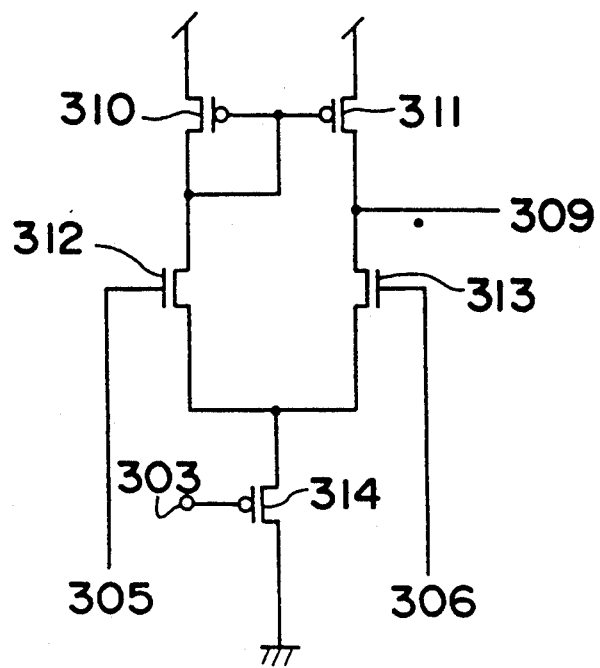
FIG. 2 is a circuit diagram showing a differential amplifier desirably applicable to the present invention.

It is desirable to use a differential amplifier for the decoder circuit as shown in FIG. 2 wherein reference numerals 312 and 313 denote N-channel transistors, 310, 311 and 314 denote P-channel transistors, 303 denotes a clock input terminal and 309 denotes an output terminal. In this circuit, a potential difference between differential amplification lines 305 and 306 is amplified and the amplified output is outputted from the output terminal 309.

2nd Preferred Embodiment

Figure 3:
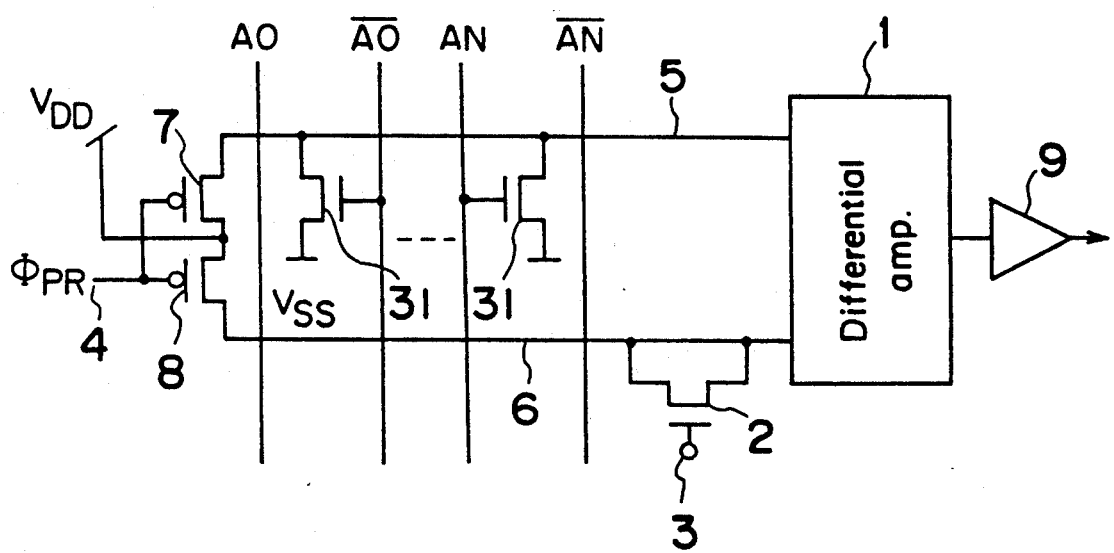
FIG. 3 is a circuit diagram of the decoder circuit according to the second preferred embodiment of the present invention.

FIG. 3 shows a decoder circuit according to the 2nd preferred embodiment of the present invention in which elements having functions same as those in FIG. 1 have the same reference numerals and, therefore, any further explanation thereabout is omitted for simplicity.

However, the differential amplifier 1 is preset so as to decide that the second differential amplification line 6 has a potential lower than that of the first one 5 when the first and second lines 5 and 6 have the same potential.

In the 2nd preferred embodiment, one N-channel transistor 2 is newly added to the second differential amplification line 6. This transistor 2 has a drain capacitance equal to a sum of those of N-channel transistors 31 and, thereby, the second differential amplification line 6 has a wiring capacitance equal to that of the first one. The gate 3 of the transistor 2 is kept at a constant potential.

Figure 4A:
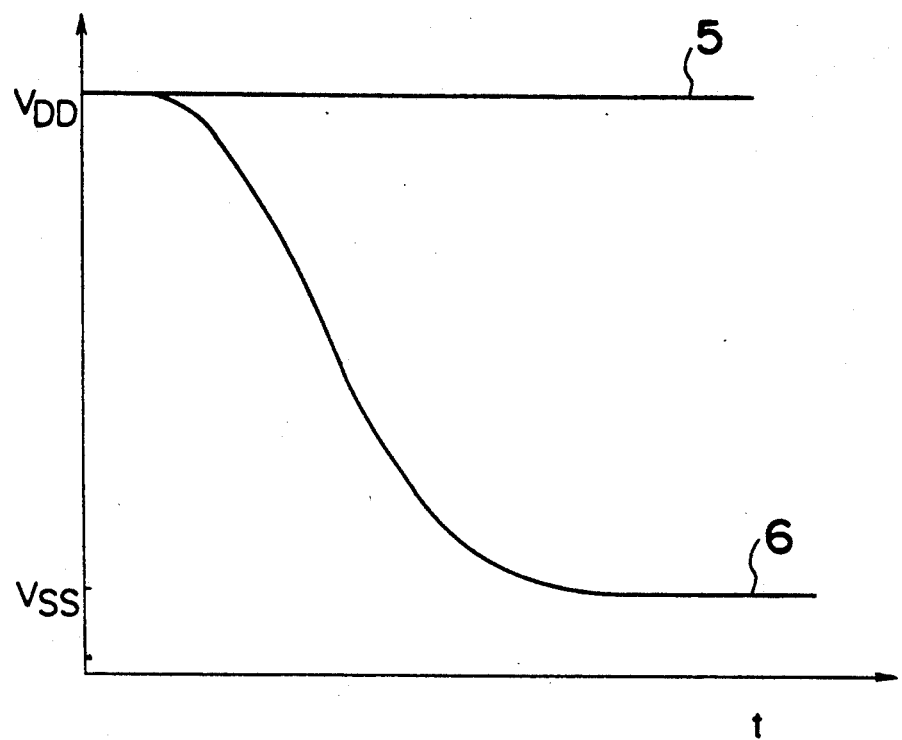
FIG. 4(a) and 4(b) are wave form diagrams showing the operation of the decoder circuit shown in FIG. 3.
Figure 4B:
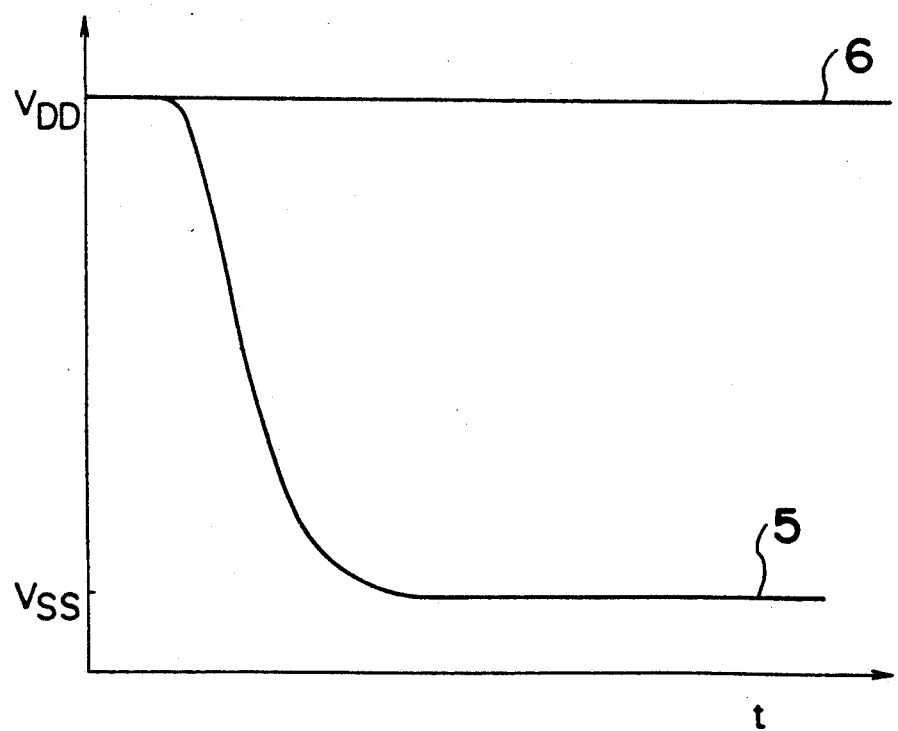

FIGS. 4(a) and 4(b) show diagrams of waveforms of the first and second differential amplification lines 5 and 6 in the cases that the decoder circuit is selected and not selected, respectively.

In operation of the decoder circuit according to the 2nd preferred embodiment, when the clock signal $\Phi_{PR}$ becomes "L" level, the P-channel transistors 7 and 8 are turned on and, thereby, the first and second differential amplification lines 5 and 6 are precharged up to the power source level $V_{DD}$.

If the input signal decode lines $\overline{AO}$ and AN are selected by applying input signal decode signals of "L" level, two N-channel transistors 31 are turned off, and accordingly, the first differential amplification line 5 is not discharged.

Since there is no potential difference between the first and second lines 5 and 6 in this case, the differential amplifier 1 judges that the second one has a lower potential than that of the first one and the potential difference therebetween is amplified and outputted through the driver 9 functioning as a buffer. Since the differential amplifier of an unbalanced type is used in this preferred embodiment, the potential of the second line 6 is lowered relatively to that of the first line 5, as shown in FIG. 4(a).

In the case that input signal decode lines $\overline{AO}$ and AN are not selected, an input signal decode signal of "H" level is applied to at least either of input signal decode lines $\overline{AO}$ and AN, and, thereby, at least either of two N-channel transistors 31 is turned on to discharge the first line 5. Thus, as shown in FIG. 4(b), the potential of the first line 5 is rapidly lowered to the ground level relatively to that of the second line 6 and the potential difference therebetween is amplified and outputted through the driver 9.

According to this preferred embodiment, since the wiring capacitances of the first and second differential amplification lines 5 and 6 can be made even by connecting a N-channel transistor to the second line 6, it becomes possible to obtain quick and exact operation of the decoder circuit.

3rd Preferred Embodiment

Figure 5:
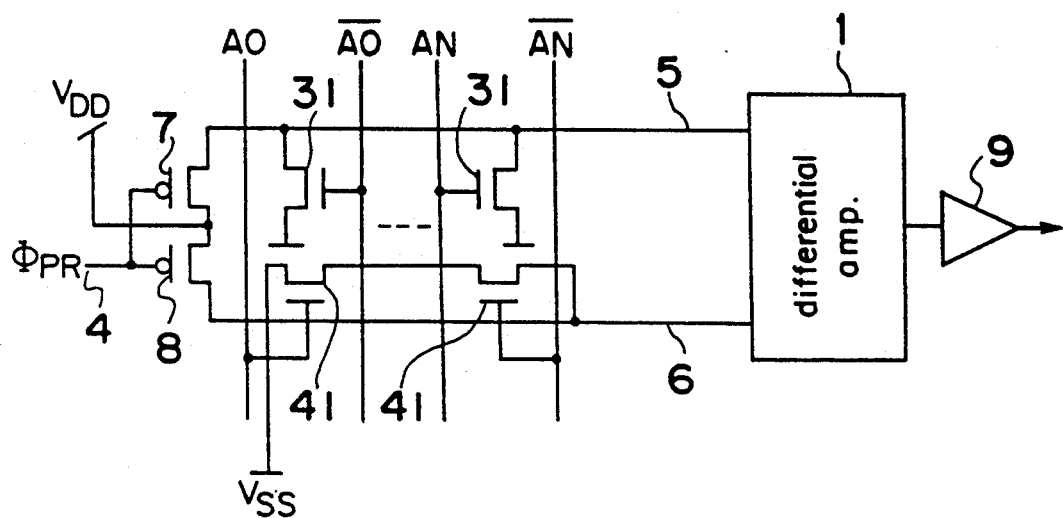
FIG. 5 is a circuit diagram of the decoder circuit according to the third prefered embodiment of the present invention.

As shown in FIG. 5, the 3rd preferred embodiment is characterized in that in this example two N-channel transistors 41 are added to the composition of the 1st preferred embodiment. The gate of each N-channel transistors 41 is connected to the input signal decode line not selected between each pair of the input signal decode lines. These N-channel transistors 41 are connected in series between the second differential amplification line 6 and the ground level $V_{SS}$.

In this preferred embodiment, when the input signal decode lines $\overline{AO}$ and AN are selected, signals of "L" level are applied to these $\overline{AO}$ and AN while signals of "H" level are applied to the other lines AO and $\overline{AN}$.

Thus, the N-channel transistors 31 are turned off to keep the precharged state of the first differential amplification line 5 but those transistors 41 connected to the second line 6 are turned on to discharge the same down to the ground level $V_{SS}$ quickly. Accordingly, the potential difference between the first and second line 5 and 6 is quickly enlarged resulting in a quick and exact response of the decoder circuit.

If the input signal decode lines $\overline{AO}$ and AN are not selected, an input signal decode signal of "H" level is applied to at least either of them and, thereby, at least either of the two N-channel transistors is turned on to discharge the first line 5 down to the ground level $V_{SS}$.

On the other hand, at least either of the N-channel transistors 41 is turned off and, accordingly, the second line 6 is not discharged down to the ground level $V_{SS}$.

Thus, a high speed and exactly operable decoder circuit can be obtained in this preferred embodiment.

4th Preferred Embodiment

Figure 6:
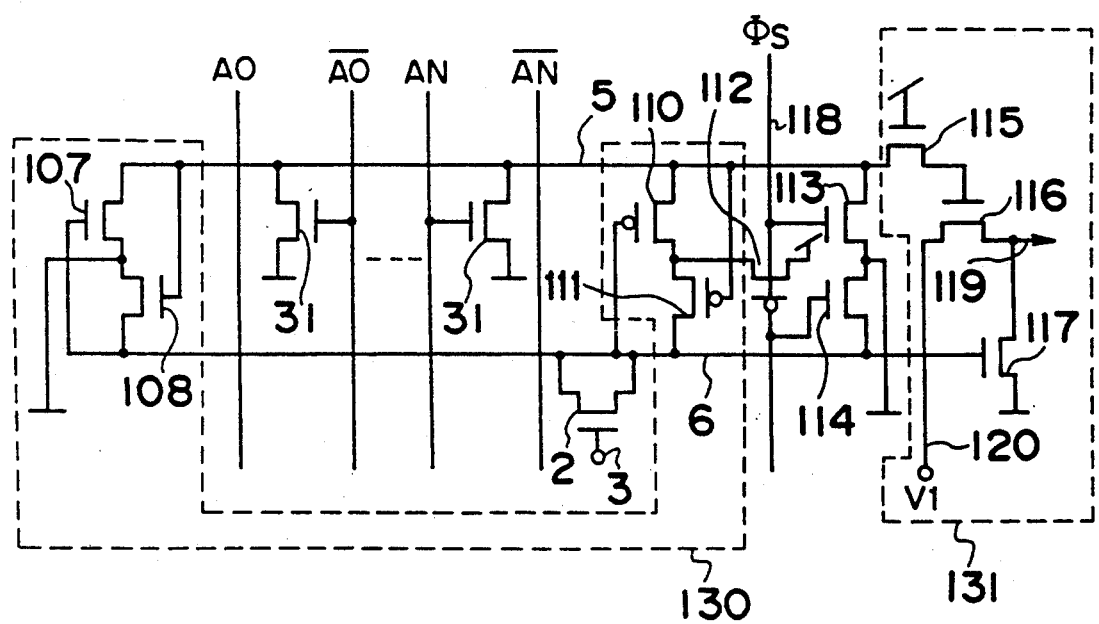
FIG. 6 is a circuit diagram of the decoder circuit according to the fourth preferred embodiment of the present invention.

FIG. 6 shows a composition of a unit of the decoder circuit according to the fourth preferred embodiment wherein elements same as those of the 2nd preferred embodiment are indicated by same reference numerals.

In FIG. 6, a reference numeral 112 denotes a P-channel transistor to which a clock signal $\Phi_S$ is input as a gate signal through a clock signal line 118, 113 and 114 denote N-channel transistors to each of which the clock signal $\Phi_S$ is input as a gate signal, 115 denotes a N-channel transistor the gate of which is connected to the power source line $V_{DD}$, 107, 108, 116 and 117 denote N-channel transistors and 110 and 111 denote P-channel transistors.

As indicated by a dotted line 130, two P-channel transistors 110 and 111 and two N-channel transistors 107 and 108 are electrically connected so as to form a sense amplifier of flip-flop type. Three N-channel transistors 115, 116 and 117 are electrically connected so as to form a driver circuit 131. Reference numerals 119 and 120 denote decode signal output terminal and decode outputting power source line V1, respectively.

In this preferred embodiment, the N-channel transistor 2 forms a capacitor having a capacitance larger than the sum of drain capacitances of two N-channel transistors 31 connected to the first differential amplification line 5 and 6, thereby, the second line 6 has a wiring capacitance larger than that of the first line 5.

The operation of the decoder circuit shown in FIG. 6 is opposite to the operation of the second preferred embodiment depicted in FIGS. 4(1) and 4(b). In FIG. 6, when the clock signal $\Phi_S$ rises up to "H" level, N-channel transistors 113 and 114 are turned on and, thereby, the first and second differential amplification lines 5 and 6 are pulled down to the ground level $V_{SS}$, as opposed to the second preferred embodiment, where the amplification lines 5 and 6 are pulled up to the power source level $V_{DD}$ as shown in FIGS. 4(a) and 4(b). When the clock signal $\Phi_S$ becomes "L" level subsequently, the first and second lines 5 and 6 are charged through the P-channel transistors 110 and 111 simultaneously. However, since the first line 5 has a smaller wiring capacitance, the potential thereof rises faster than that of the second line and, thereby, a potential difference is caused therebetween. This potential difference is amplified by the sense amplifier 130 of flip-flop type consisted of N-channel transistors 107 and 108 and P-channel transistors 110 and 111. At this time, when the input signal decode lines $\overline{AO}$ and AN are selected by applying signals of "L" level, the N-channel transistors 31 are turned off and, thereby, the first line 5 is not discharged. The decoded signal is outputted through the driver 131 as a buffer.

On the other hand, if the decode lines $\overline{AO}$ and AN are not selected, a decode signal of "H" level is applied to at least one of them and, thereby, at least one of two N-channel transistors 31 is turned on to discharge the first line 5. The potential difference between first and second lines 5 and 6 is amplified by the sense amplifier 130 of flip-flop type and they become ground and "H"

levels, respectively. The decoded signal is outputted through the driver 131.

Figure 7:
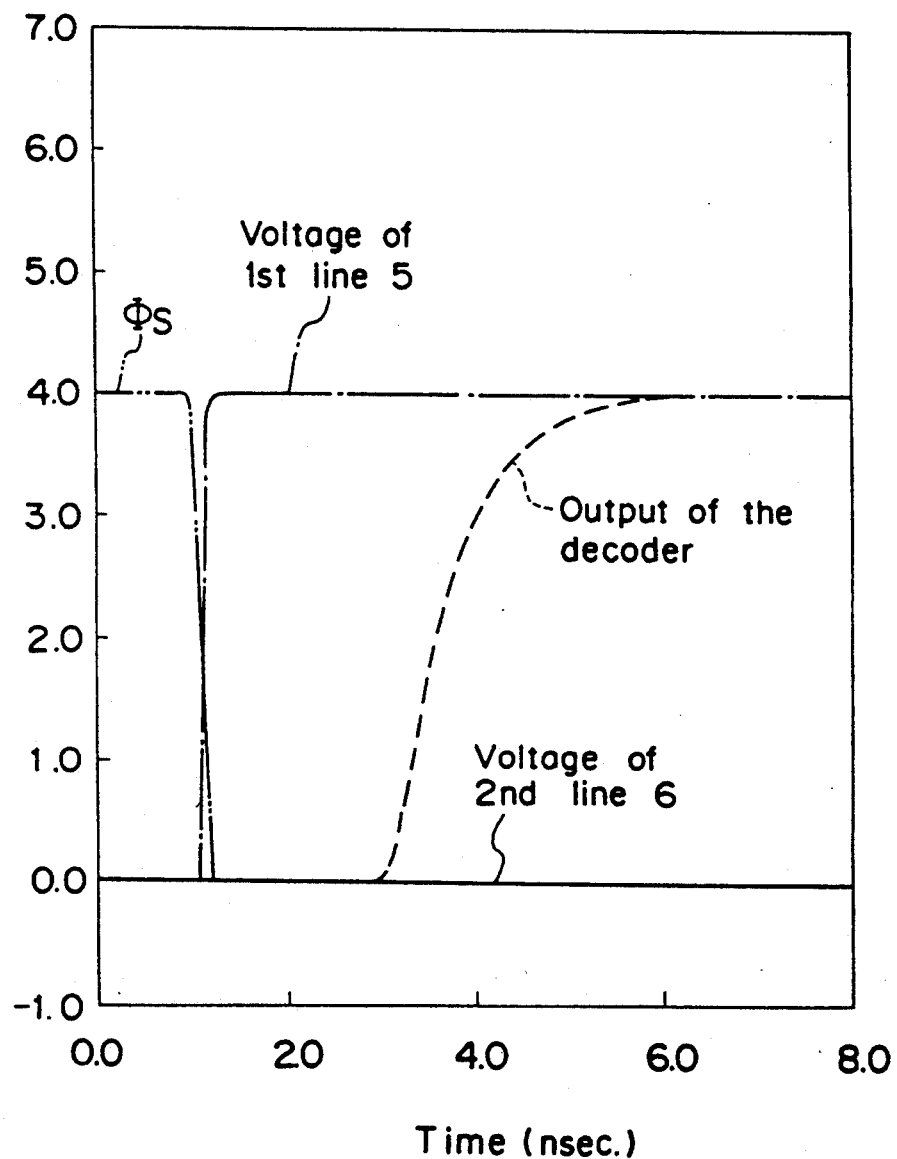
FIG. 7 is a time chart showing the operation of the decoder circuit shown in FIG. 6 which is obtained by simulation using SPICE.

FIG. 7 shows results of simulation regarding the operation of the decoder circuit shown in FIG. 6 with use of SPICE.

As shown in FIG. 7 clearly, the voltage of the first differential amplification line 5 is raised up to the power source level $V_{DD}$ very quickly when the clock signal $\Phi_S$ falls down to "L" level. The delay time of the rise of the first line 5 is about 0.1 nsec.. Then, output of the decoder rises up to "H" level as indicated by a dotted line in FIG. 7.

5th Preferred Embodiment

Figure 8:
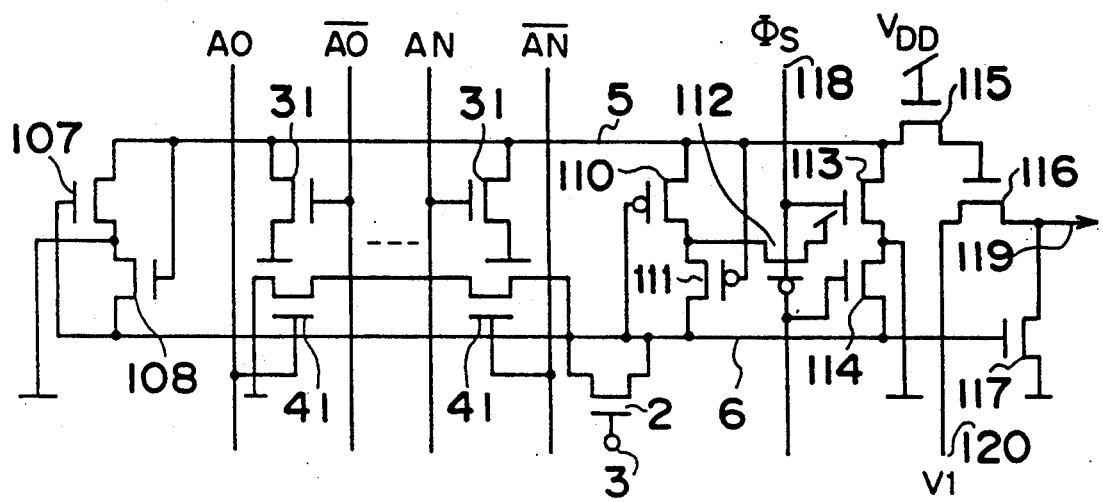
FIG. 8, 9 and 10 are circuit diagrams of the decoder circuit according to the fifth, sixth and seventh preferred embodiments of the present invention, respectively.

FIG. 8 shows a composition according to the fifth preferred embodiment of the present invention.

In this preferred embodiment, there is provided in this example two N-channel transistors 41 connected in series between the second differential amplification line 6 and the ground in addition to the composition of the fourth preferred embodiment. Each gate of these transistors 41 is connected to the input signal decode line not selected. The role of these transistors 41 is substantially the same as that of the third preferred embodiment. Namely, when the lines $\overline{AO}$ and AN selected by applying signals of "L" level thereto, the first differential amplification line 5 is not discharged while the second line 6 is quickly discharged to the ground level by these N-channel transistors 41 since they is turned on by signals of "H" level applied to their gates, respectively. Thus, they contribute to speed up the operation of the decoder circuit.

Other operation of this decoder circuit are substantially the same as those of the fourth preferred embodiment, and therefore, further explanation is omitted.

6th Preferred Embodiment

Figure 9:
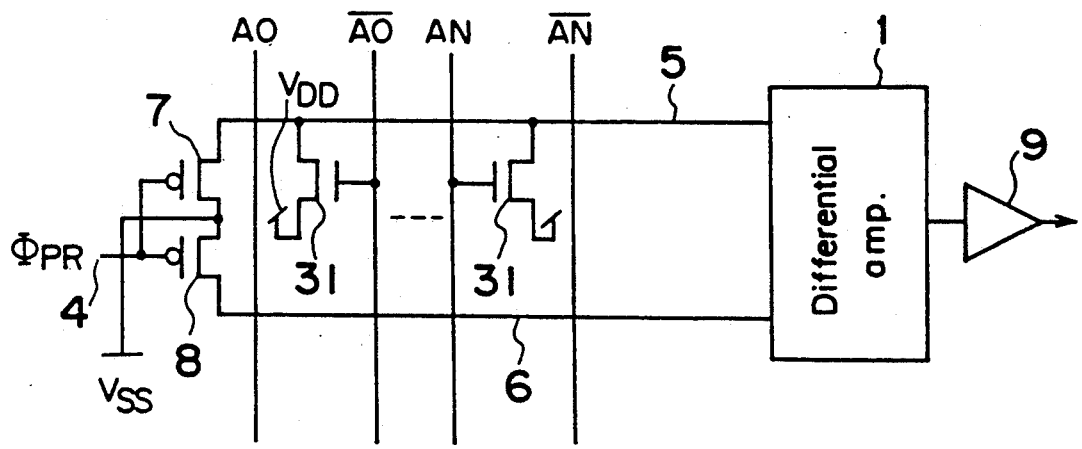

FIG. 9 shows the sixth preferred embodiment of the present invention.

As is apparent from comparison of FIG. 9 with FIG. 1, the present preferred embodiment is different from the first preferred embodiment in that N-channel transistors 31 are connected to the power source line $V_{DD}$ while P-channel transistors 7 and 8 are connected to the ground line.

In this case, when two P-channel transistors 7 and 8 are turned on by a clock signal of "L" level, the first and second differential amplification lines 5 and 6 are pulled down to the ground level. Thereafter, when input signal decode lines $\overline{AO}$ and AN are selected by applying signals of "L" level thereto, two N-channel transistors 31 are turned off and, thereby, the first line 5 is maintained at the power source level.

When the input signal decode lines $\overline{AO}$ and AN are not selected, an input signal decode signal of "H" level is applied to at least either of the lines $\overline{AO}$ and AN and, thereby, at least one of the N-channel transistors 31 is turned on to pull the first amplification line 5 up to the power source level. The differential amplifier 1 amplifies the potential difference thus caused and outputs the result through the driver.

7th Preferred Embodiment

Figure 10:
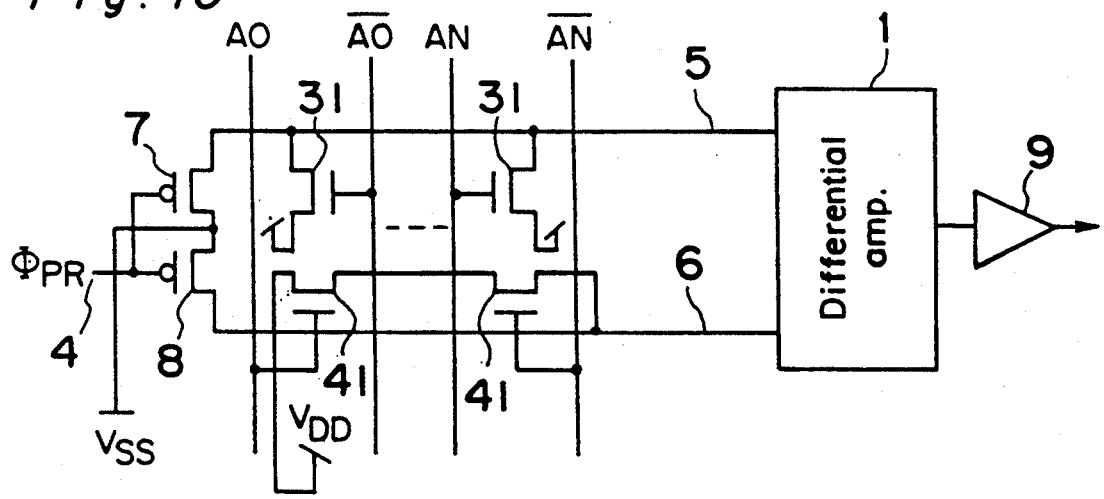

FIG. 10 shows a decoder circuit according to the seventh preferred embodiment of the present invention.

As is apparent from comparison of FIG. 10 with FIG. 5 showing the third preferred embodiment of the present invention, this preferred embodiment is different only in that P-channel transistors 7 and 8 are connected to the ground level and all N-channel transistors 31 and 41 are connected to the power source level.

The operation of the decoder circuit according to this preferred embodiment is substantially the same as the sixth preferred embodiment shown in FIG. 9 and, therefore, further explanation is omitted.

Figure 11:
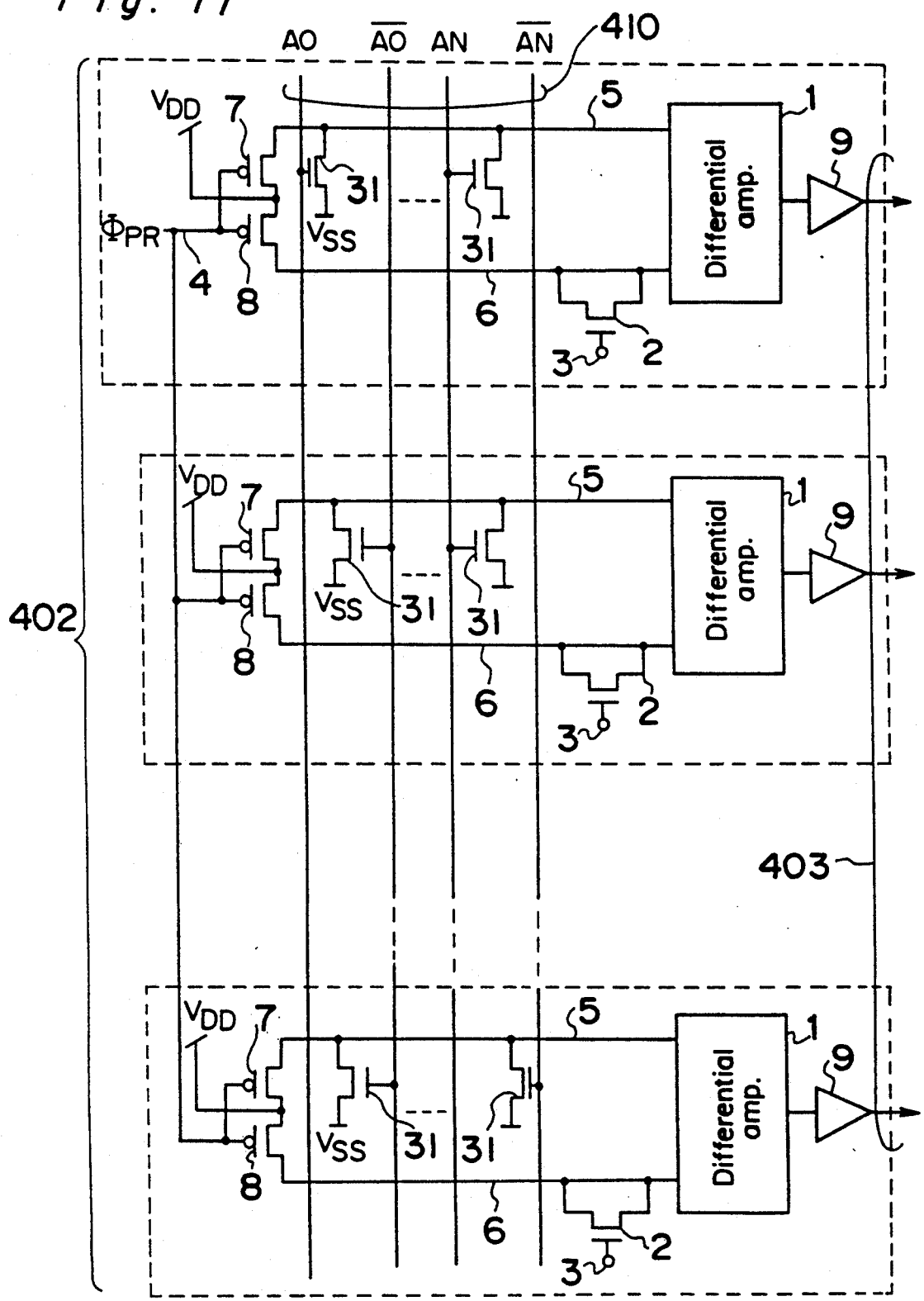
FIG. 11 is a circuit diagram of a row decoder using decoder circuits according to the second preferred embodiment shown in FIG. 3.

FIG. 11 shows an example of the row decoder to be used in a DRAM as shown in FIG. 12 wherein each unit of the row decoder 402 is consisted of a circuit shown in FIG. 3.

Figure 13:
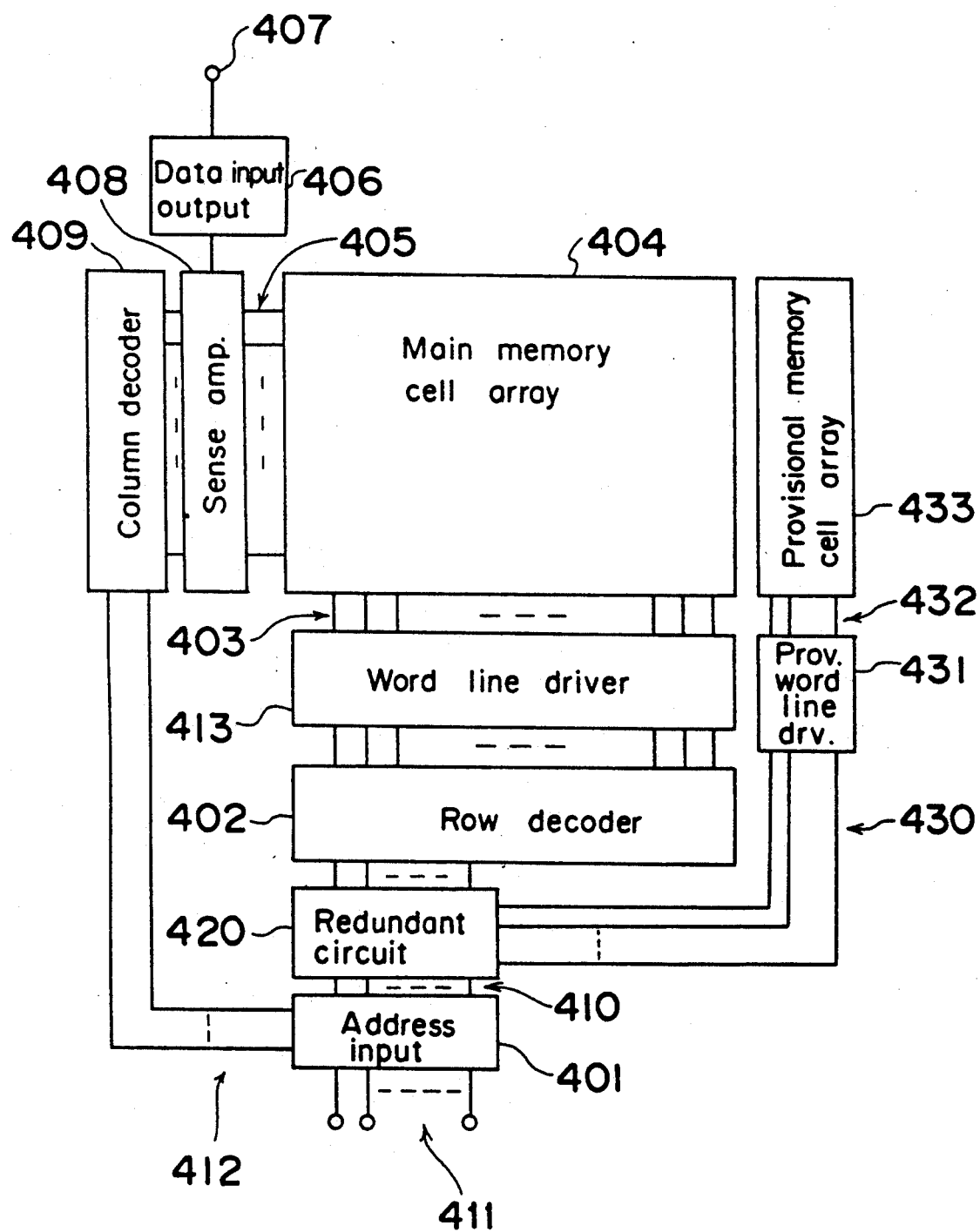
FIG. 13 is a block diagram of DRAM with a redundant circuit for switching from a main memory cell array to a provisional memory cell array.

The decoder circuit according to the present invention is applicable to an address selection circuit used for a DRAM with a redundant switching circuit as shown in FIG. 13. This DRAM provides a provisional memory cell array 433 in addition to a main memory cell 404. The redundant switching circuit 420 stores address data regarding defective memory cells of the main memory cell 404 and switches from the main memory cell 404 to the provisional memory cell array 433 when an address included in the stored address data is input thereto. Other elements of the DRAM are essentially the same as those of the DRAM shown in FIG. 12 and, therefore, further explanation is omitted.

Figure 14:
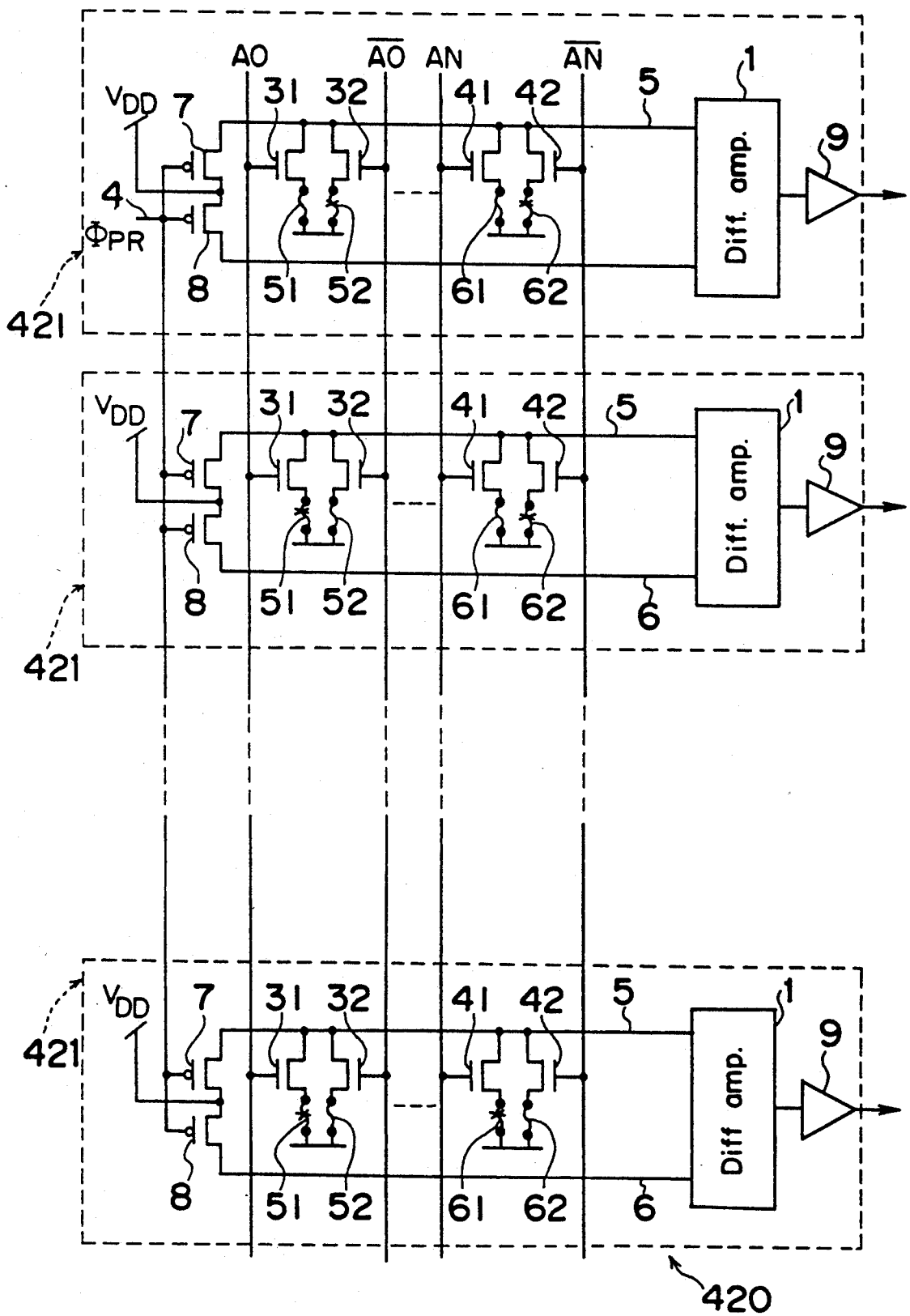
FIG. 14 is a block diagram of the redundant switching circuit of the DRAM shown in FIG. 13.

FIG. 14 shows a redundant switching circuit 420 to which the present invention is applied. The redundant switch circuit 420 is comprised of n address selection circuits 421.

Each address selection circuit 421 provides a differential amplifier 1 to which first and second differential amplification lines 5 and 6 are input. Between the first and second lines 5 and 6, two p-channel transistors 7 and 8 are connected in parallel to the power source line and both gates are connected to a clock signal line 4. Between the first differential amplification line 5 and a ground line are two N-channel transistors 31 and 32 or 41 and 42 and fuses 51 and 52 or 61 and 62 each gate of which is connected to each input signal decoder line AO, $\overline{AO}$, AN or $\overline{AN}$. These fuses are selectively melted down according to the address data regarding the defective memory cells of the main memory cell array 404 as indicated in FIG. 14 by marks "X". The N-channel transistor connected to a fuse not melted down operates so as to pull down the first differential amplification line 5 when a decode signal of "L" level is applied to the gate thereof. Namely, this circuit operates similarly to the decoder circuit mentioned above.

Figure 15:
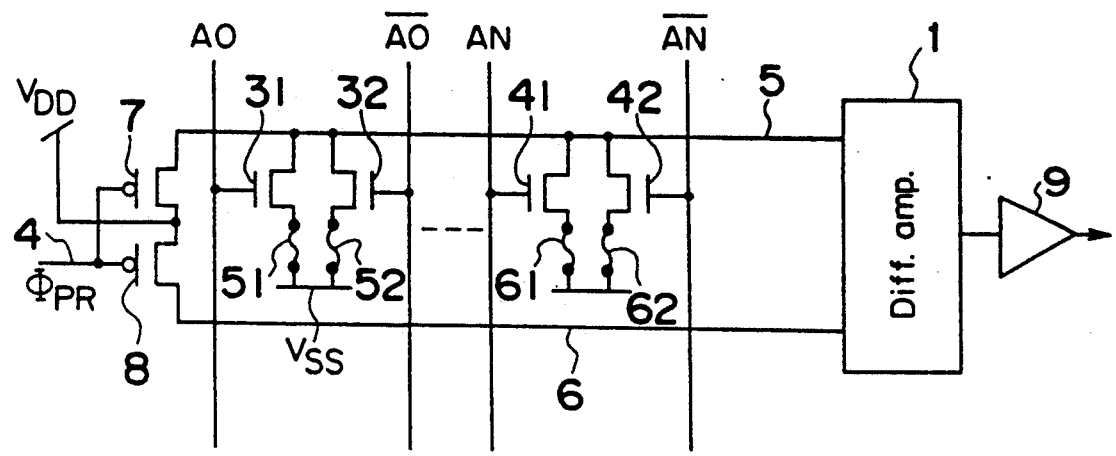
FIGS. 15, 16, 17 and 18 are circuit diagrams of the redundant circuit according to the present invention.
Figure 16:
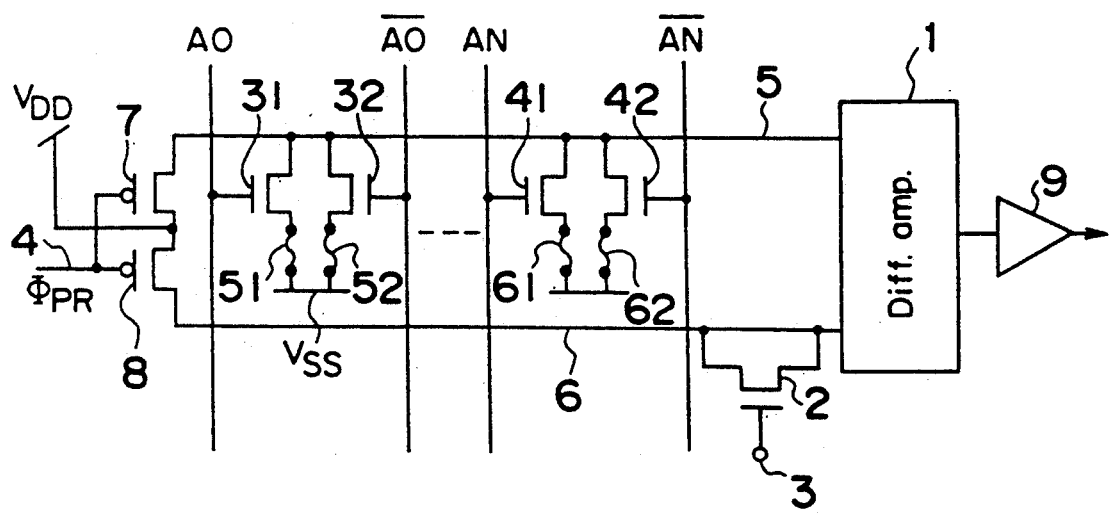
Figure 17:
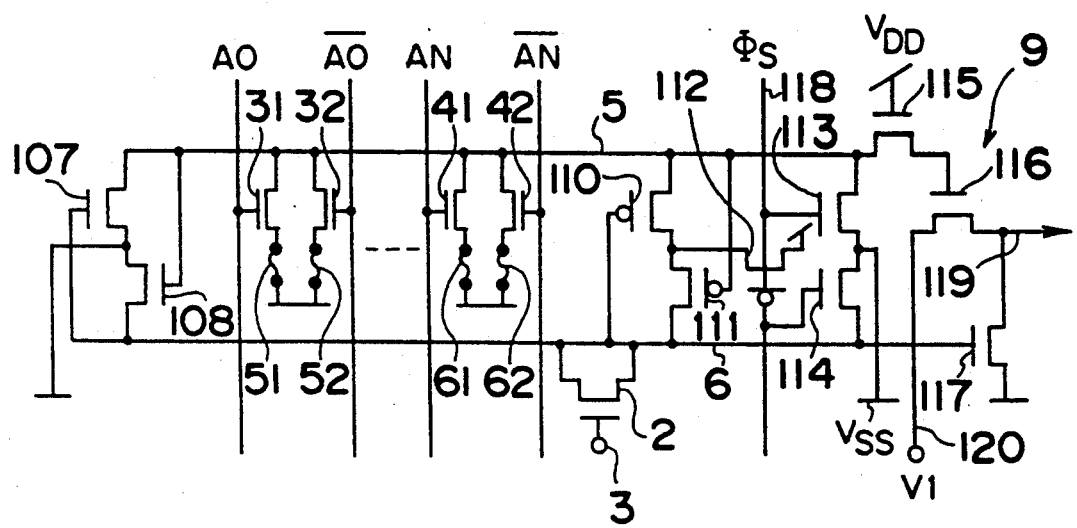

FIG. 15, 16 and 17 shown address selection circuits corresponding to the decoder circuits shown in FIGS. 1, 3 and 6, respectively.

Figure 18:
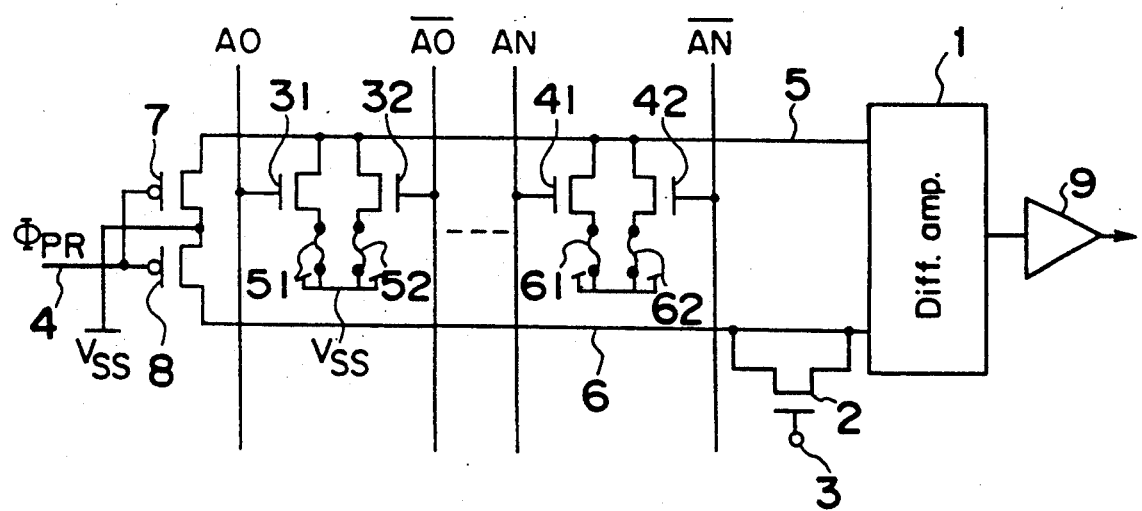
Figure 19:
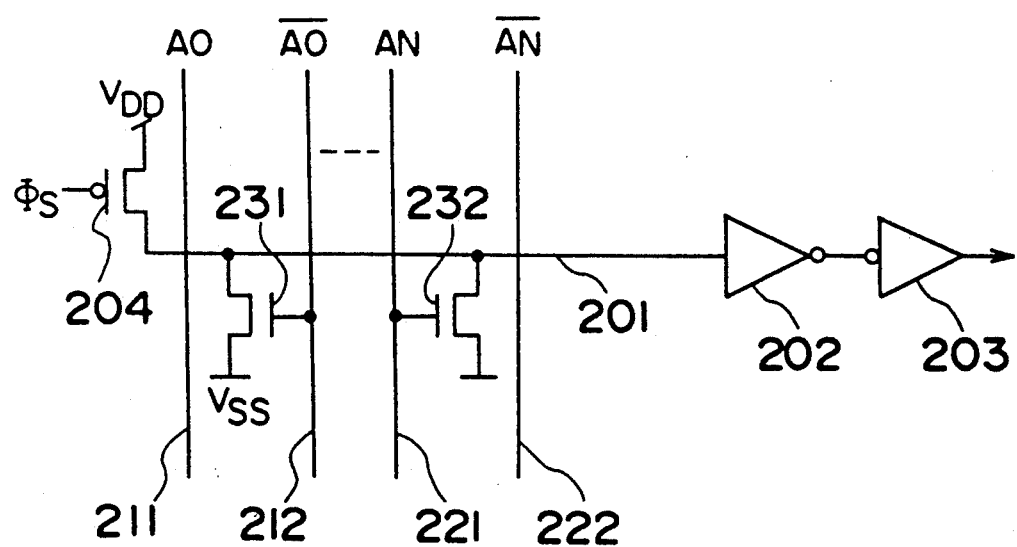
FIG. 19 is a circuit diagram of a conventional decoder circuit.

The address selection circuit shown in FIG. 18 corresponds to the decoder circuit shown in FIG. 9 with a N-channel transistor 3 as shown in FIG. 2.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A decoder circuit comprising
   a differential amplifier,
   first and second differential amplification lines connected to said differential amplifier, a voltage setting means for setting said first and second differential amplification lines at a predetermined voltage in response to a clock signal, and at least one voltage changing means for changing the voltage of said first differential amplification line from said predetermined voltage to another voltage in response to either of a pair of input signal decode signals.

2. The decoder circuit according to claim 1 in which said differential amplifier is of an unbalanced type so as to amplify voltages of said first and second differential amplification lines to different potentials.

3. The decoder circuit according to claim 1 in which said voltage setting means comprises a pair of P-channel transistors connected between said first and second differential amplification lines to a voltage line having the predetermined voltage, each of said P-channel transistors having a gate connected to a clock signal line.

4. The decoder circuit according to claim 1 wherein each voltage changing means comprises an N-channel transistor connected between said first differential amplification line and a voltage line having said another voltage, said N-channel transistor having a gate being connected to either of a pair of input signal decode lines.

5. The decoder circuit according to claim 1 further comprising a means for adjusting a capacitance of said second differential amplification line.

6. An address selection circuit being comprised of a plurality of decoding units each connected to a pair of inverted and non-inverted address signal lines, said decoding unit comprising a differential amplifier, first and second differential amplification lines connected to said differential amplifier, a voltage setting means for setting said first and second differential amplification lines at a predetermined voltage in response to a clock signal, a pair of voltage changing means for changing the voltage of said first differential amplification line from said predetermined voltage to another voltage in response to either of said pair of inverted and non-inverted address signals, said pair of voltage changing means being connected to the pair of inverted and non-inverted address lines, respectively, and fuse means connected to each of said pair of voltage changing means for making said voltage changing means inactive in the case that said fuse means has been melted down beforehand.

7. The decoder circuit according to claim 1 further comprising a second voltage changing means for changing the voltage of said second differential amplification line from the predetermined voltage to another voltage in response to either of another pair of input signal decode signals.

* * * * *

UNITED STATES PATENT AND TRADEMARK OFFICE
CERTIFICATE OF CORRECTION

PATENT NO. : 5,237,217
DATED : August 17, 1993
INVENTOR(S) : Junko Hasegawa et al.

It is certified that error appears in the above-identified patent and that said Letters Patent is hereby corrected as shown below:

Column 2, Line 11, after "of" (first occurrence) insert --the--.

Column 2, Line 52, "metted" should read --melted--.

Column 3, Line 4, "prefered" should read --preferred--.

Column 3, Line 12, "FIG." should read --FIGS.--.

Column 3, Line 66, "An" should read --AN--.

Column 4, Line 58, "one" should read --differential amplification line--.

Column 5, Line 39, "a" should read --an--.

Column 6, line 18, "a" (second occurrence) should read --an--

Column 6, Line 35, delete "6,".

Column 7, Line 29, "is" should read --are--.

Column 7, Line 33, "are" should read --is--.

UNITED STATES PATENT AND TRADEMARK OFFICE
CERTIFICATE OF CORRECTION

PATENT NO. : 5,237,217

DATED : August 17, 1993

INVENTOR(S) : Junko Hasegawa et al.

It is certified that error appears in the above-identified patent and that said Letters Patent is hereby corrected as shown below:

Column 8, Line 49, "FIG." should read --FIGS.--.

Column 8, Line 53, "a" should read --an--.

Column 8, Line 54, "3" should read --2--, and "2" should read --3--.

Signed and Sealed this

Third Day of May, 1994

Attest:

BRUCE LEHMAN

*Attesting Officer*  *Commissioner of Patents and Trademarks*